United States Patent
Corcoles Gonzalez et al.

(10) Patent No.: US 8,954,125 B2
(45) Date of Patent: Feb. 10, 2015

(54) LOW-LOSS SUPERCONDUCTING DEVICES

(75) Inventors: Antonio D. Corcoles Gonzalez, Mount Kisco, NY (US); Jiansong Gao, Boulder, CO (US); Dustin A. Hite, Boulder, CO (US); George A. Keefe, Cortlandt Manor, NY (US); David P. Pappas, Louisville, CO (US); Mary E. Rothwell, Ridgefield, CT (US); Matthias Steffen, Cortlandt Manor, NY (US); Chang C. Tsuei, Chappaqua, NY (US); Michael R. Vissers, Erie, CO (US); David S. Wisbey, Lafayette, CO (US)

(73) Assignees: International Business Machines Corporation, Armonk, NY (US); The United States of America, as represented by the Secretary of Commerce, The National Institute of Standards, Washington, DC (US)

( * ) Notice: Subject to any disclaimer, the term of this patent is extended or adjusted under 35 U.S.C. 154(b) by 640 days.

(21) Appl. No.: 13/192,597

(22) Filed: Jul. 28, 2011

(65) Prior Publication Data

US 2013/0029848 A1 Jan. 31, 2013

(51) Int. Cl.
*H01L 39/14* (2006.01)
*H01L 39/24* (2006.01)
(Continued)

(52) U.S. Cl.
CPC .......... *H01L 39/2416* (2013.01); *G06N 99/002* (2013.01); *H01L 39/14* (2013.01);
(Continued)

(58) Field of Classification Search
CPC . H01L 39/12; H01L 39/2416; H01L 39/2415; H01L 39/2461; H01L 39/2493; H01L 25/00; H01P 7/06; H01P 7/065; C23C 16/303; C23C 16/34; C23C 16/345

USPC ......... 505/210, 220, 237, 238, 470, 472, 701, 505/818; 428/698, 930; 427/62, 96.1, 427/255.391, 419.7, 595; 333/227, 231; 326/1, 3; 327/366–367, 527–528, 564; 438/665

See application file for complete search history.

(56) References Cited

U.S. PATENT DOCUMENTS

| | | | | |
|---|---|---|---|---|
| 4,897,709 A | * | 1/1990 | Yokoyama et al. | ........... 257/301 |
| 4,925,830 A | | 5/1990 | Walsh | |

(Continued)

FOREIGN PATENT DOCUMENTS

| | | |
|---|---|---|
| JP | 1170102 A | 7/1989 |
| JP | 3219729 A | 9/1991 |
| JP | 3236606 A | 10/1991 |

OTHER PUBLICATIONS

M.R. Vissers et al., "Low Loss Superconducting Titanium Nitride Coplanar Waveguide Resonators," Applied Physics Letters, Dec. 2010, pp. 232509-1-232509-3, vol. 97, No. 23.*

(Continued)

*Primary Examiner* — Stanley Silverman
*Assistant Examiner* — Kallambella Vijayakumar
(74) *Attorney, Agent, or Firm* — Vazken Alexanian; Ryan, Mason & Lewis, LLP (57) ABSTRACT

Low-loss superconducting devices and methods for fabricating low loss superconducting devices. For example, superconducting devices, such as superconducting resonator devices, are formed with a (200)-oriented texture titanium nitride (TiN) layer to provide high Q, low loss resonator structures particularly suitable for application to radio-frequency (RF) and/or microwave superconducting resonators, such as coplanar waveguide superconducting resonators. In one aspect, a method of forming a superconducting device includes forming a silicon nitride (SiN) seed layer on a substrate, and forming a (200)-oriented texture titanium nitride (TiN) layer on the SiN seed layer.

20 Claims, 4 Drawing Sheets

(51) Int. Cl.
| | |
|---|---|
| H01B 12/06 | (2006.01) |
| H01P 1/203 | (2006.01) |
| H01P 3/00 | (2006.01) |
| G06N 99/00 | (2010.01) |
| H01L 39/22 | (2006.01) |
| H01P 1/201 | (2006.01) |
| H01P 3/02 | (2006.01) |

(52) U.S. Cl.
CPC .............. *H01L 39/223* (2013.01); *H01P 1/201* (2013.01); *H01P 1/2013* (2013.01); *H01P 3/003* (2013.01); *H01P 3/026* (2013.01)
USPC ........... 505/210; 505/220; 505/470; 505/472; 505/183; 505/238; 333/227; 333/99 S; 327/564; 427/62

(56) References Cited

U.S. PATENT DOCUMENTS

| | | | | |
|---|---|---|---|---|
| 5,145,833 | A | | 9/1992 | Prunier, Jr. et al. |
| 5,324,713 | A | | 6/1994 | Shen |
| 5,406,123 | A | * | 4/1995 | Narayan ................. 257/767 |
| 5,747,361 | A | * | 5/1998 | Ouellet ................... 438/643 |
| 5,863,869 | A | | 1/1999 | Chaudhari et al. |
| 5,888,942 | A | | 3/1999 | Matthaei |
| 6,114,764 | A | * | 9/2000 | Hoshino et al. ......... 257/751 |
| 6,484,043 | B1 | | 11/2002 | Klein et al. |
| 7,610,072 | B2 | | 10/2009 | Ye |

OTHER PUBLICATIONS

Benjamin A. Mazin, "Microwave Kinetic Inductance Detectors: The First Decade," AIP Conference Proceedings, Dec. 2009, pp. 135-142, vol. 1185, No. 1.*

N.N. Iosad et al., "Texture Formation in Sputter-Deposited (Nb0.7, Ti0.3)N Thin Films," Journal of Applied Physics, Nov. 2002, pp. 4999-5005, Vol, 92, No. 9.

M. Shandalov et al., "Microstructure and Morphology Evolution in Chemical Solution Deposited Semiconductor Films: 2. PbSe on As Face of GaAs(111)," European Physical Journal Applied Physics, Oct. 2004, pp. 51-57, vol. 28, No. 1.

P.K. Day et al., "A Broadband Superconducting Detector Suitable for Use in Large Arrays," Letters to Nature, Oct. 2003, pp. 817-821, vol. 425, No. 6960.

G. Vardulakis et al., "Superconducting Kinetic Inductance Detectors for Astrophysics," Measurement Science and Technology, Jan. 2008, pp. 015509-1-015509-10, vol. 19, No. 1.

A. Wallraff et al., "Strong Coupling of a Single Photon to a Superconducting Qubit Using Circuit Quantum Electrodynamics," Letters to Nature, Sep. 2004, pp. 162-167, vol. 431, No. 7005.

J. Majer et al., "Coupling Superconducting Qubits Via a Cavity Bus," Letters to Nature, Sep. 2007, pp. 443-447, vol. 449, No. 7161.

M. Hofheinz et al., "Synthesizing Arbitrary Quantum States in a Superconducting Resonator," Letters to Nature, May 2009, pp. 546-549, vol. 459, No. 7246.

J. Gao et al., "Experimental Evidence for a Surface Distribution of Two-Level Systems in Superconducting Lithographed Microwave Resonators," Applied Physics Letters, Apr. 2008, pp. 152505-1-152505-3, vol. 92, No. 15.

H. Wang et al., "Improving the Coherence Time of Superconducting Coplanar Resonators," Applied Physics Letters, Sep. 2009, pp. 233508-1-233508-3, vol. 95, No. 23.

P. Macha et al., "Losses in Coplanar Waveguide Resonators at Millikelvin Temperatures," Applied Physics Letters, Feb. 2010, pp. 062503-1-062503-3, vol. 96, No. 6.

\* cited by examiner

LOW-LOSS SUPERCONDUCTING DEVICES

GOVERNMENT RIGHTS

This invention was made with Government support under Contract No.: HR0011-06-C-0051A awarded by the Defense Advanced Research Projects Agency (DARPA). The Government has certain rights in this invention.

FIELD OF THE INVENTION

The present invention relates generally to low-loss superconducting devices such as resonator devices, and methods for fabricating low loss superconducting devices.

BACKGROUND OF THE INVENTION

Superconducting devices, such as resonator devices, are used in versatile applications such as high-frequency filters, photon detection in astrophysics research, and quantum bits ("qubits") for quantum computing. The success of these applications often requires low-loss operation of the resonators, especially in quantum computing. The quest for materials that have low loss in RF resonant structures at low temperatures is an area of great interest for quantum computation and photon detection. Indeed, low loss, i.e., high quality factor, in these applications is necessary to have long resonant lifetimes at low power, and well-resolved frequencies and low noise at high power Important examples are the storage of arbitrary quantum states in superconducting resonators at very low fields, i.e., in the single photon regime where the electric field is much less than the critical field, and multiplexed readout of kinetic inductance photon detectors.

Superconducting materials such as Al, Re, and Nb on crystalline substrates such as silicon and sapphire are capable of producing low internal loss, $\delta_i$, and therefore high internal quality factors $$\left(Q_i = \frac{1}{\delta_i}\right)$$

of approximately $10^5$-$10^6$ in a high field regime. However, when restricted to low field levels such as used in superconducting quantum information applications, quality factors are reduced to the $10^4$-$10^5$ range. This limits reproducible lifetimes, $\tau=Q/2\pi f$, to be approximately 1 µs when operated in the 1-10 GHz range. It is well accepted that parasitic two-level systems (TLS) in oxides at surfaces, interfaces, and dielectrics contribute predominantly to the losses in these structures. Nitrides, on the other hand, are very stable, especially against oxidation.

Despite the significant progress that has been made towards understanding various loss mechanisms, materials properties have not been used to optimize the performance (e.g., minimize the loss) of a superconducting resonator.

SUMMARY OF THE INVENTION

Aspects of the invention generally include low-loss superconducting devices such as resonator devices, and methods for fabricating low loss superconducting resonator devices. More specifically, aspects of the invention include superconducting resonator devices formed with a (200)-oriented texture titanium nitride (TiN) layer to provide high Q, low loss resonator structures particularly suitable for application to radio frequency (RF) and/or microwave superconducting resonators.

In one aspect of the invention, a method of forming a superconducting device includes forming a silicon nitride seed layer on a substrate, and forming a (200)-oriented texture titanium nitride layer on the SiN seed layer. The TiN and SiN layers are patterned to form a superconducting device such as a resonator device.

In other aspects of the invention, the superconducting device may be a coplanar waveguide structure, a resonator device formed by a lumped capacitor and inductor element connected in parallel, or a qubit device. The qubit device includes an interdigitated capacitor pattern formed by patterning the (200)-oriented texture TiN film and SiN layers formed on a substrate (e.g., silicon substrate or sapphire substrate).

In another aspect of the invention, an integrated circuit includes a substrate, and one or more superconducting devices formed on the substrate. Each superconducting device includes a silicon nitride seed layer disposed over the substrate, and a (200)-oriented texture titanium nitride layer disposed over the SiN seed layer.

These and other aspects, features and advantages of the present invention will become apparent from the following detailed description of illustrative embodiments thereof, which is to be read in connection with the accompanying drawings.

DETAILED DESCRIPTION OF PREFERRED EMBODIMENTS

Preferred embodiments of the invention will now be described in further detail with regard to low-loss superconducting devices and methods for fabricating low loss superconducting devices. In particular, preferred embodiments of the invention include superconducting resonator structures formed with a (200)-oriented texture titanium nitride (TiN) film to provide high Q, low loss superconducting devices such as superconducting resonator devices, quantum bit ("qubit")

devices, etc. It is to be understood that principles of the invention are not intended to be limited to any particular type of superconducting resonator device as described herein, and that other suitable resonators are contemplated as being within the scope of the invention. As used herein, the variable "Q" and the term "Q value" refers to an internal quality factor defined as the reciprocal of the internal loss associated with a resonator. Higher Q values represent lower losses and are, therefore, desirable in many applications.

Figure 1:
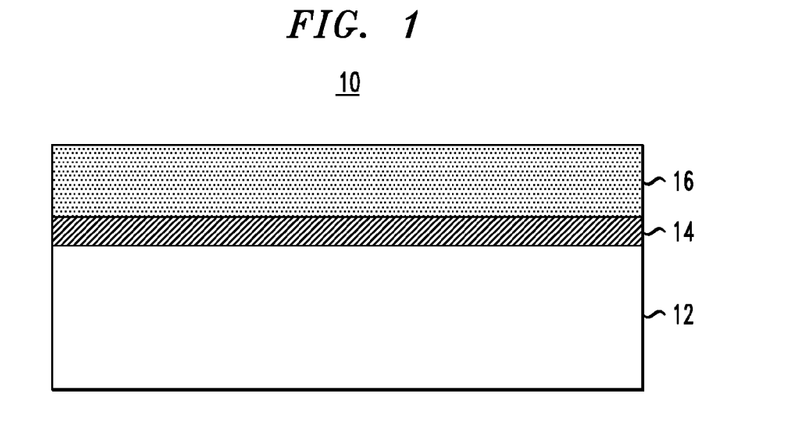
FIG. 1 schematically illustrates a superconducting device comprising a low-loss superconducting layer according to an aspect of the invention.

FIG. 1 schematically illustrates a superconducting device comprising a low-loss superconducting layer according to an aspect of the invention. More specifically, FIG. 1 schematically illustrates a stacked structure 10 comprising a substrate 12, a seed layer 14 (or buffer layer) formed on the substrate 12, and a superconducting layer 16 formed on the seed layer 14. As discussed in further detail below, the superconducting layer 16 and seed layer 14 may be patterned using standard photolithographic and etch methods to form superconducting devices, such as the exemplary device structures shown in FIGS. 4-8. The substrate 12 may be a crystalline substrate, wherein examples of crystalline substrates suitable for use in illustrative embodiments of the present invention include, but are not limited to, sapphire (e.g., c-plane sapphire) and semiconductor silicon substrates, such as Si(100) wafers and/or hydrogen-terminated intrinsic silicon (H:i-Si).

The seed layer 14 is preferably formed of a thin layer of nitride, such as silicon nitride (SiN). The SiN seed layer 14 is preferable formed to have a thickness of approximately 1 nm to 3 nm. The superconductor layer 16 is preferably formed of a thin nitride film such as titanium nitride (TiN), which is formed on the seed layer 14. In accordance with preferred embodiments of the invention, the superconductor layer 16 is formed of a (200)-oriented texture TiN film on top of a thin SiN seed layer 14 to provide a high Q, low loss resonator device. It is been determined that when TiN is used as a superconducting material, resonators structure in which the TiN has a predominantly (200)-oriented texture will provide higher Q values than resonators in which a superconductor layer includes a mixture of (200)-oriented TiN and (111)-oriented TiN or in which the TiN is predominantly (111)-oriented. Exemplary methods for forming a superconducting device having a low-loss superconducting layer will now be described with reference to FIGS. 2 and 3.

Figure 2:
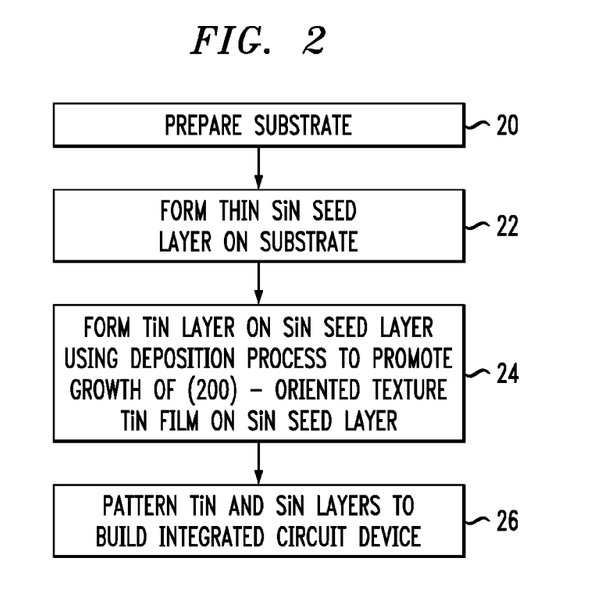
FIG. 2 is a flow diagram of a method for forming a superconducting device having a low-loss superconducting layer according to an aspect of the invention.

FIG. 2 is a flow diagram of a method for forming a semiconductor device having a low-loss superconducting layer according to an aspect of the invention. In particular, the method of FIG. 2 begins with preparing a semiconductor substrate for subsequent processing (step 20). In embodiments in which a sapphire substrate is used, this preparation step may include performing an in situ anneal. For example, in an embodiment in which a c-plane sapphire substrate is used, step 20 may include performing an in situ anneal to approximately 900° C. in an oxygen atmosphere. In embodiments where a silicon substrate is used, step 20 may include etching the silicon substrate to remove native oxide and to hydrogen terminate the surface of the wafer, thereby forming H:i-Si (as will be discussed in further detail below with reference to FIG. 3).

A next step in the process of FIG. 2 is to form a thin seed layer on the semiconductor substrate (step 22). In one exemplary embodiment of the invention, the seed layer is a thin silicon nitride (SiN) seed layer that is formed over the surface of the substrate. In one preferred embodiment, the SiN seed layer is formed with a thickness of approximately 1 nm to 3 nm. The SiN seed layer may be formed using known techniques such as CVD (chemical vapor deposition) or other suitable methods for forming a thin SiN seed layer on a substrate (e.g., silicon or sapphire substrate). Next, a superconducting layer is formed over the seed layer (step 24). In one preferred embodiment, step 24 comprises forming a titanium nitride (TiN) layer on the SiN seed layer using a deposition process to promote growth of a (200)-oriented texture TiN film on the SiN seed layer. In one preferred embodiment, the superconducting layer formed is formed of a (200)-oriented texture TiN film having a thickness of approximately 40 nm. Once the seed and superconductor layers are formed, the layers are patterned using, e.g., a photolithographic process, to form a resonator structure comprising electrodes or components formed by the patterned layers (examples of which will be described below with reference to FIGS. 4-8).

Figure 3:
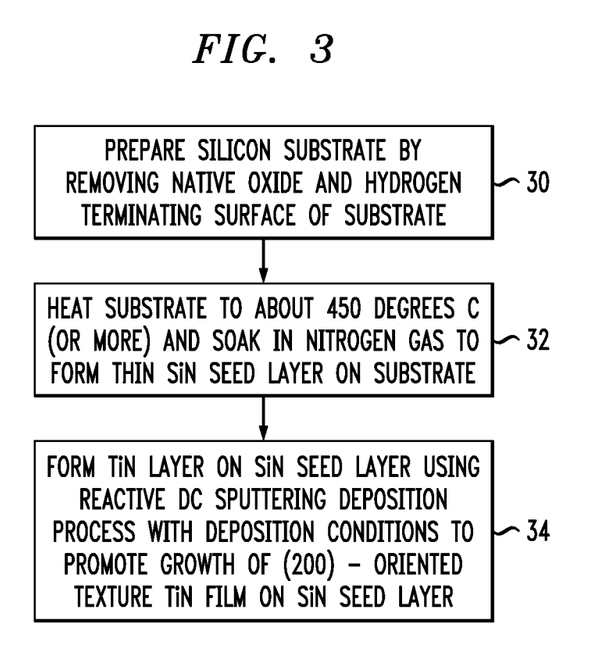
FIG. 3 is a flow diagram of a method for forming a superconducting device having a low-loss superconducting layer according to another aspect of the invention.

FIG. 3 is a flow diagram of a method for forming a semiconductor device having a low-loss superconducting layer according to another aspect of the invention. In particular, FIG. 3 illustrates an exemplary method similar to that of FIG. 2 that may be employed in embodiments where a silicon substrate is employed. In particular, as depicted in FIG. 3, a step of preparing a silicon substrate includes removing native oxide from a surface of the silicon substrate and hydrogen terminating the surface of the silicon substrate (step 30). In one exemplary embodiment, with a Si(100) wafer, which may initially have approximately 2-3 nm of surface oxide, the process of preparing the silicon substrate may include etching the silicon substrate in a 10:1 $H_2O$:HF solution to remove any native oxide and hydrogen terminate the surface and produce an (H:i-Si) substrate with only about one monolayer (0.2 nm) of surface oxide.

Thereafter, to form a thin SiN seed layer on the silicon substrate, the silicon substrate is heated to approximately 450° C. or more (more preferably, approximately 500° C. or more) and soaked in nitrogen gas for one minute (step 32). This process forms a SiN seed layer of about 1 nm in thickness before forming a TiN superconductor layer on the seed layer. Advantageously, in the high-temperature growth process, the Si substrate (i.e. H: i-Si) acquires a layer of SiN that allows nucleation of the low-energy (200)-textured TiN film growth. This thin silicon nitride film formed deliberately or unintentionally at the interface between the superconductor layer and the substrate in a resonator structure, can serve as buffer layer for reducing two-level defects as a source of loss. The benefit of such loss reducing mechanism becomes ineffective if the nitride interface grows too thick, because its amorphous or highly disordered structure can bring in too many two-level like defects.

Next, a titanium nitride (TiN) layer is formed on the SiN seed layer using a reactive DC sputtering deposition process with deposition conditions to promote growth of a (200)-oriented texture TiN film on the SiN seed layer (step 34). In one preferred embodiment, the TiN superconducting layer is formed with a thickness of approximately 40 nm. In one preferred embodiment, the reactive DC sputter deposition conditions include heating the substrate to a temperature of approximately 500° C., applying a DC bias on the substrate of approximately 100V, applying a sputtering atmosphere having a mixture of 3:2 argon to nitrogen ratio at a pressure of approximately 5 mTorr, and growing the TiN film at a growth rate of approximately 1 nm/min to 2 nm/min.

It is to be appreciated that various types of superconducting devices may be formed with superconducting resonator structures that are fabricated using techniques as discussed herein to include a superconducting (200)-oriented texture TiN layer to provide high Q, low loss resonator devices. Exemplary superconducting devices having low loss, high Q resonator structures will now be discussed in further detail with reference to FIGS. 4-8.

Figure 4:
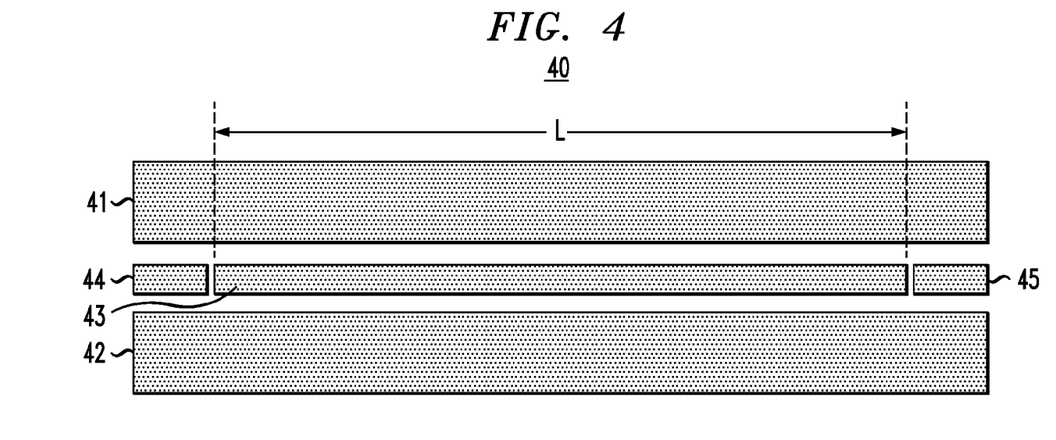
FIG. 4 schematically illustrates a superconducting resonator device having a low-loss superconducting layer according to an aspect of the invention.

FIG. 4 schematically illustrates a superconducting resonator device having a low-loss superconducting layer according to an aspect of the invention. More specifically, FIG. 4 schematically illustrates a coplanar waveguide resonator device 40, which may be formed having a (200)-oriented texture TiN superconducting layer using methods as discussed herein. In FIG. 4, the coplanar waveguide resonator device 40 includes a well-known structure having ground plane conductors 41 and 42 and a centerline conductor 43 disposed between the ground conductors 41. The elements 44 and 45 form coupling capacitor structures on both ends of the centerline conductor 43 providing a ½ wavelength resonator structure, wherein a length L of the center conductor 43 primarily defines the resonant frequency of the ½ wavelength resonator. In accordance with exemplary embodiments of the invention, the various elements 41, 42, 43, 44 and 45 of the coplanar waveguide resonator device 40 can be formed by patterning a SiN seed layer and (200)-oriented texture TiN film on a semiconductor substrate to form a low loss, high Q coplanar waveguide resonator device.

Figure 5:
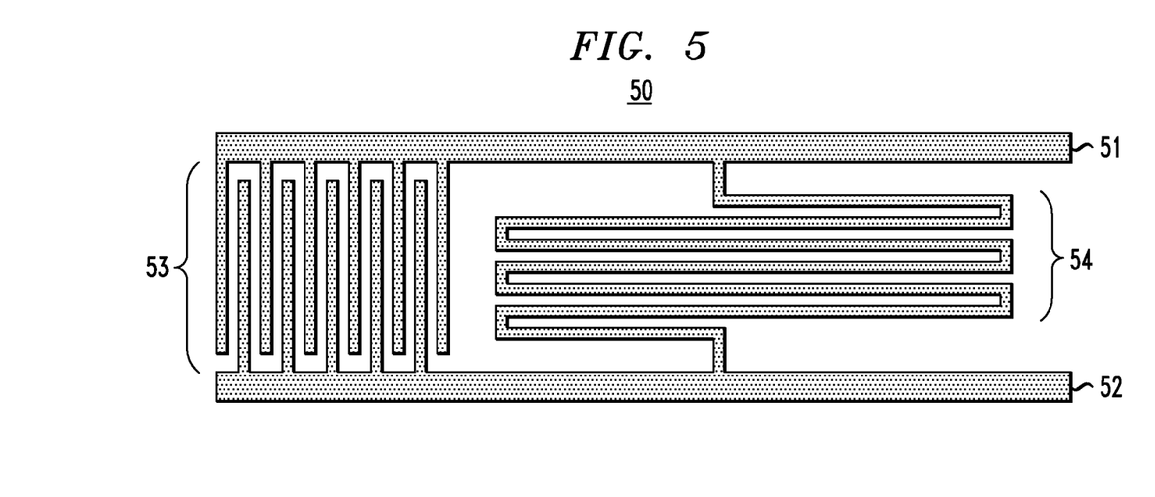
FIG. 5 schematically illustrates a superconducting resonator device having a low-loss superconducting layer according to another aspect of the invention.

FIG. 5 schematically illustrates a superconducting resonator device having a low-loss superconducting layer according to another aspect of the invention. More specifically, FIG. 5 schematically illustrates a lumped element resonator device 50 that may be formed with a (200)-oriented texture TiN superconducting layer. In FIG. 5, the resonator device 50 includes a well-known structure having end terminals 51 and 52 with an interdigitated capacitor structure 53 and planar meander inductor structure 54 connected in parallel between terminals 51 and 52. The inductor 54 may be formed having a spiral structure or other known planar inductor structures commonly used to form a LC resonator structure as shown in FIG. 5. In accordance with exemplary embodiments of the invention, the various elements 51, 52, 53, and 54 of the resonator structure 50 can be formed by patterning a SiN seed layer and (200)-oriented texture TiN film on a semiconductor substrate to form a low loss, high Q resonator device.

Figure 6:
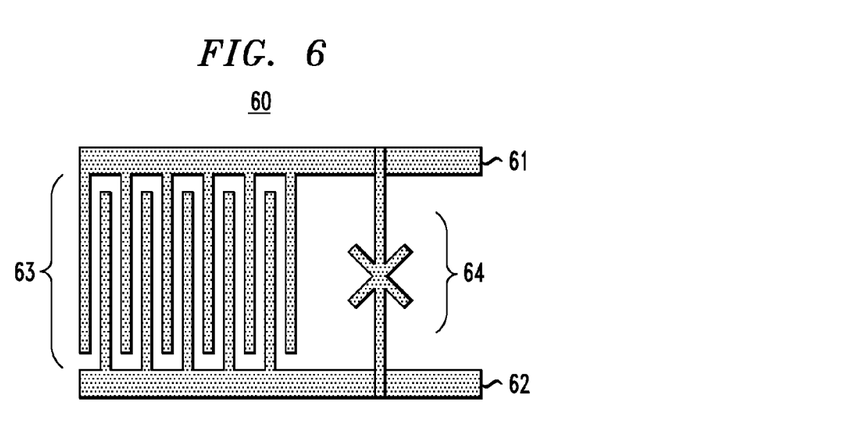
FIG. 6 schematically illustrates a superconducting qubit device having a low-loss superconducting layer according to an aspect of the invention.

FIG. 6 schematically illustrates a superconducting qubit device having a low-loss superconducting layer according to an aspect of the invention. More specifically, FIG. 6 schematically illustrates a qubit structure 60 that may be formed having a (200)-oriented texture TiN superconducting layer using methods as discussed herein. In FIG. 6, the qubit structure 60 includes a well-known structure having terminals 61 and 62, an interdigitated capacitor structure 63 formed between terminals 61 and 62, and a single Josephson junction structure 64 connected in parallel to the capacitor 63 between terminals 61 and 62. In accordance with exemplary embodiments of the invention, the various elements 61, 62 and 63 of the qubit structure 60 can be formed by patterning a SiN seed layer and (200)-oriented texture TiN film on a semiconductor substrate to form a low loss, high Q resonator device. The Josephson structure 64 can be realized by means of conventional shadow evaporation techniques using Aluminum, wherein the structure 64 is formed of a stacked layer comprising an insulating layer disposed (sandwiched) between two superconducting layers of Aluminum, for example.

Figure 7:
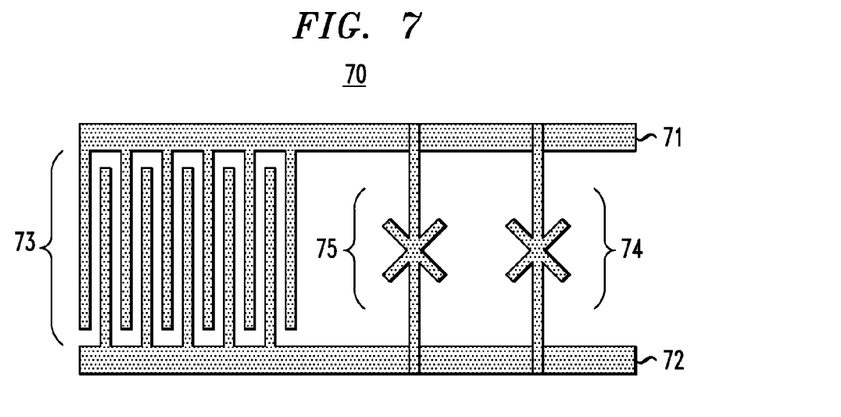
FIG. 7 schematically illustrates a superconducting qubit device having a low-loss superconducting layer according to another aspect of the invention.

FIG. 7 schematically illustrates a superconducting qubit device having a low-loss superconducting layer according to another aspect of the invention. More specifically, FIG. 7 schematically illustrates another qubit structure 70 that may be formed having a (200)-oriented texture TiN superconducting layer using methods as discussed herein. In FIG. 7, the qubit structure 70 includes a well-known structure having terminals 71 and 72, an interdigitated capacitor structure 73 formed between terminals 71 and 72 and two Josephson junction structures 74 and 75 connected in parallel to the capacitor 73 between terminals 71 and 72. In accordance with exemplary embodiments of the invention, the various elements 71, 72 and 73 of the qubit structure 70 can be formed by patterning a SiN seed layer and (200)-oriented texture TiN film on a semiconductor substrate to form a low loss, high Q resonator device. The Josephson structures 74 and 75 can be realized by mean of conventional shadow evaporation techniques using Aluminum, wherein the Josephson structures 74 and 75 are each formed of a stacked layer comprising an insulating layer disposed (sandwiched) between two superconducting layers of Aluminum, for example.

Figure 8:
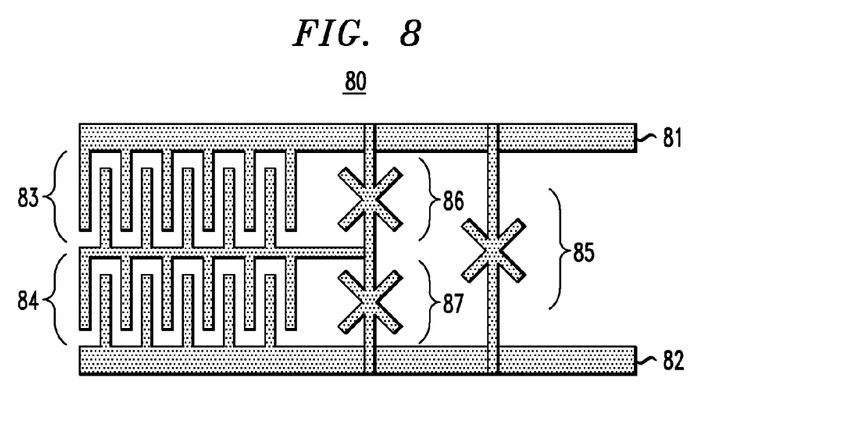
FIG. 8 schematically illustrates a superconducting qubit device having a low-loss superconducting layer according to another aspect of the invention.

FIG. 8 schematically illustrates a superconducting qubit device having a low-loss superconducting layer according to another aspect of the invention. More specifically, FIG. 8 schematically illustrates another qubit structure 80 that may be formed having a (200)-oriented texture TiN superconducting layer using methods as discussed herein. In FIG. 8, the qubit structure 80 includes a well-known structure having terminals 81 and 82, two serially connected interdigitated capacitor structures 83 and 84 formed between terminals 81 and 82 and a single Josephson junction structure 85 connected between the terminals 81 and 82, and two additional Josephson structures 86 and 87 serially connected between terminals 81 and 82. In this qubit structure 80, the capacitor structure is split into two capacitors structures 83 and 84 and shunted between the Josephson structures 86 and 87. In accordance with exemplary embodiments of the invention, the various elements 81, 82, 83 and 84 of the qubit structure 80 can be formed by patterning a SiN seed layer and (200)-oriented texture TiN film on a semiconductor substrate to form a low loss, high Q resonator device. The Josephson structures 85, 86 and 87 can be realized by means of conventional shadow evaporation techniques using Aluminum, wherein the Josephson structures 85, 86 and 87 are each formed of a stacked layer comprising an insulating layer disposed (sandwiched) between two superconducting layers of Aluminum, for example.

Through various experiments with TiN films as discussed in detail below, we have discovered that superconducting resonators with exceptionally high $Q_i$, on the order of $10^7$ at high field, can be achieved by fabricating resonator structures having TiN films with a (200)-oriented texture. While TiN is a superconductor with a relatively high $T_C$, with stoichiometric TiN yielding higher than 4 K, we have found through experiments that the growth mode and morphology of TiN are sensitive to a wide range of parameters, including film thickness, substrate temperature, bias, and crystallinity.

Our experiments involved reactively dc sputter depositing 40 nm thick TiN films onto c-plane sapphire and H-terminated, intrinsic Si (100), (H:i-Si), substrates (>15 kΩ cm) with and without pre-deposited SiN buffer layers. The sapphire wafer was prepared with an in situ anneal to 900° C. in an oxygen atmosphere, while the Si wafers were prepared by etching in a 10:1 $H_2O$:HF solution to remove any native oxide and to hydrogen terminate the surface. In situ ellipsometry and Auger data on the freshly loaded H:i-Si substrates showed evidence of approximately one monolayer (0.2 nm) surface oxide, compared to 2-3 nm for unetched silicon wafers. However, by performing a 1 min soak in nitrogen gas with the sputtering source operating before opening the shutter, we found that a thin nitride film was formed prior to TiN deposition when the Si substrate was hot.

Thereafter, a TiN deposition was performed at 500° C. with a dc bias on the substrate of −100 V. The pressure was held at approximately 5 mTorr in a reactive mixture of 3:2 argon to nitrogen, with a growth rate of approximately 1 nm/min to 2 nm/min. The TiN films obtained were in the high nitrogen percentage limit, and we obtained $T_C$ (critical temperature) measurements between 4.2 and 4.6 K. Moreover, in situ reflection high-energy electron diffraction measurements were taken, which indicated that TiN films grown on sapphire are well ordered and crystalline, while TiN films grown on Si and SiN were highly disordered and polycrystalline. Finally, atomic force microscopy studies of the surface indicated that the rms roughness of the films was typically less than 1 nm.

To conduct RF loss studies, the TiN films were patterned into frequency multiplexed, coplanar waveguide (CPW), and half-wave resonators capacitively coupled to a microwave feed-line. This arrangement allowed us to extract $Q_i$ data from $S_{21}$ (insertion loss) transmission measurements. The CPW resonators had a 3 um wide centerline and a 2 um gap. They were patterned from the TiN film using standard photolithography techniques and a reactive ion etch (RIE) in a $SF_6$ plasma. The resonances were measured in an adiabatic demagnetization refrigerator at temperatures below 100 mK. The sample box holding the resonator chip was magnetically shielded with an outer cryoperm and inner superconducting shield. Measurements were performed using a vector network analyzer with a combination of attenuators (room temperature and cold) on the input line to achieve the appropriate power level at the device input port and a microwave isolator and high electron mobility transistor amplifier on the output. The strength of the electric field, E, in the resonators was calculated in the standard manner from the power applied, the attenuation before the sample, the measured resonance parameters, and the CPW gap.

From our experiments measuring the resonance at high field, we found measured total $Q_R$'s as well as $Q_i$'s well in excess of $1\times10^6$. Some of the best resonators in our experiments resulted in $Q_i$'s that were higher than $10^7$, an order of magnitude higher than typical Nb, Al, or Re devices made in this geometry. Since any TLS are fully saturated in the many photon regime, the high power measurements were an indication that there is low intrinsic loss of the superconducting TiN surface.

Based on experimental data obtained with regard to loss as a function of electric field for a number of samples, we found that TiN films that were grown on a nitrided, intrinsic Si substrate had nearly two orders of magnitude lower loss than those TiN films grown on bare sapphire with growth conditions nominally the same. From the observation that the films grown on sapphire are more crystalline, we chose to use an amorphous buffer layer on the sapphire to inhibit nucleation of nonequilibrium epitaxy, thus allowing the TiN film to grow in its low-energy orientation. A buffer layer of SiN was chosen because it has lower loss than $SiO_x$. For 35 nm SiN on sapphire, we recovered the very low loss behavior at high power obtained with Si substrates. The residual loss is in line with what is expected for the filling factor and TLS contribution of the SiN. To make a more direct comparison, we also used SiN buffer layers on H:i-Si substrates. The loss curves from TiN on 50 and 150 nm SiN buffer layers showed the same low loss at high power as for TiN on the nitrided, intrinsic Si. The magnitude of the loss at low field is in qualitative agreement with the thickness of the SiN on the substrate, with the 150 nm buffer layer sample show showing the highest loss by a factor of 2-3, as expected.

To better understand the correlation of the RF properties and film structure, we conducted ex situ x-ray diffraction (XRD) and scanning electron microscopy (SEM) as well as in situ ellipsometry and Auger electron spectroscopy (AES). From the resulting θ-2θ scans obtained with regard to TiN films grown on different substrates and buffer layers, we found that TiN growth on a bare sapphire substrate results in a mixture of (111)-TiN and (200)-TiN, while TiN growth on a sapphire substrate with a SiN buffer layer results in a TiN film that is nearly all (200)-oriented, with a very weak (111) peak. We also found that the results from growth on H:i-Si at high temperature (500° C.) matches best with the SiN/sapphire, indicating a similar growth mode.

We also observed a (111)-TiN orientation when a TiN film was grown on an H:i-Si substrate at a low temperature. The quality factors of resonators fabricated from these samples were significantly diminished relative to those made from films grown at high temperature, resulting in $Q_i$'s of 400K and 225K at high and low powers, respectively. This translates into losses from 2.5 to $4.5\times10^{-6}$, comparable to those grown on sapphire. This data allows us to hypothesize that, in the high temperature growth process, the silicon substrate is acquiring a layer of SiN that allows nucleation of the low-energy (200)-TiN film growth. Compared to the low power data, we expected this layer to be relatively thin, approximately a factor of 10 less than the 50 nm buffer layer. Furthermore, at low field, the loss for the freshly prepared (200)-TiN film without a pre-deposited SiN buffer layer was typically around $2\times10^{-6}$, significantly better than for conventional superconducting resonators.

We also found that the measured resonant frequencies of these devices were significantly lower than that expected by considering only the geometric inductance, suggesting significant kinetic inductance contribution. From the 40 nm thick, (200)-TiN films, we found the ratio $f_{r,meas}/f_{r,geom}=0.56\pm0.04$. On the other hand, the (111)-TiN grown on Si and sapphire had a ratio $f_{r,meas}/f_{r,geom}=0.30\pm0.01$. Using a known variational method, we found the measured frequency shifts correspond to London penetration depths of $\lambda_L=275$ and 575 nm, respectively. These numbers compare well with the penetration depths of 352 and 714 nm calculated from the measured resistance just above $T_C$ ($\rho_n=45$ and 185 μΩ cm) using the BCS local relationship among $\lambda_L$, $\rho_n$, and the gap, $\Delta$ (i.e., $T_C$).

Moreover, an in situ analysis also confirmed that the Si in a high temperature growth process acquires a thin nitride layer prior to the TiN deposition. First, we observed from ellipsometry a small rotation of light, consistent with formation of a 1.5±0.5 nm layer of SiN. In addition, Auger spectra data was taken from the Si substrate before and after a pre-sputtering nitrogen soak. Before a nitrogen soak, we found an Si peak at an un-shifted energy of 92 eV, characteristic of a clean, unoxidized, or nitrided surface. However, after a nitrogen soak, we found that the Si peak shifted down to 84 eV and a nitrogen peak of about the same size is in evidence. This data illustrates that surface is completely nitrided to at least 1 nm. These spectra show the presence of a thin layer of SiN, which is advantageous for the formation of high quality TiN films.

Finally, from an SEM analysis, we found that a SF6 RIE used to pattern the TiN film etches the Si at a higher rate, resulting in trenching around the CPW, leaving a flat undercut of approximately 100 nm under the TiN. This profile is further confirmation of a thin SiN layer under the TiN because it acts as a resist against the etch.

In conclusion, we have found that the RF loss in superconducting TiN films is dependent upon its growth mode, and is both substrate and temperature specific. A (200)-oriented TiN growth results in resonators with internal $Q_i$ exceeding $10^7$ at high field. The presence of (111)-TiN is correlated with depressed quality factors. From in situ analysis and tests using buffer layers, we found that a (200)-oriented TiN film is stabilized when grown on SiN. For low field measurements, enhanced quality factors were also observed from samples with the thinnest SiN interfacial layers. There are many applications for high Q resonators fabricated with low loss (200)-oriented texture TiN films, including quantum information and photon detectors. For the photon detectors, e.g., kinetic inductance detectors, it is advantageous to either use a very thin SiN buffer layer or to localize the TiN/SiN at a voltage node to reduce phase noise due to two-level systems. Our findings also suggest the possibilities of fabricating high Q TiN resonators on suspended SiN membranes, which may lead to other interesting applications.

It will be appreciated and should be understood that the exemplary embodiments of the invention described above can be implemented in a number of different fashions. Given the teachings of the invention provided herein, one of ordinary skill in the related art will be able to contemplate other implementations of the invention. Indeed, although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

The invention claimed is:

1. A method of forming a superconducting device, comprising:
    forming a silicon nitride (SiN) seed layer on a substrate, wherein the SiN seed layer is formed with a thickness in a range of about 1 nm to about 3 nm; and
    growing a (200)-oriented texture titanium nitride (TiN) layer on the SiN seed layer using the SiN seed layer for nucleation of the (200)-oriented texture TiN layer growth.

2. The method of claim 1, wherein the substrate is a silicon substrate, the method further comprising preparing the silicon substrate by removing native oxide from a surface of the silicon substrate and hydrogen terminating the surface of the silicon substrate.

3. The method of claim 1, wherein the substrate is a sapphire substrate, the method further comprising preparing the sapphire substrate by performing an in situ anneal to approximately 900° C. in an oxygen atmosphere.

4. The method of claim 1, wherein growing a SiN seed layer comprises:
    heating the substrate, comprising a silicon substrate, to a temperature of approximately 450° C. to 500° C.; and
    soaking the heated silicon substrate in nitrogen gas sufficient to form the SiN seed layer.

5. The method of claim 1, wherein the (200)-oriented texture TiN layer is formed by a reactive DC sputtering deposition process.

6. The method of claim 5, wherein the sputtering process is performed at a temperature of approximately 450° C. to 500° C.

7. The method of claim 5, wherein the sputtering process is performed by applying a DC bias of approximately −100V on the substrate.

8. The method of claim 5, wherein the sputtering process is performed in a sputtering atmosphere of approximately 3:2 argon to nitrogen ratio.

9. The method of claim 5, wherein the sputtering process is performed in a sputtering atmosphere at a pressure of approximately 5 mTorr.

10. The method of claim 5, wherein the (200)-oriented texture TiN layer is grown at a growth rate of approximately 1 nm to 2 nm per minute.

11. The method of claim 1, further comprising patterning the (200)-oriented texture TiN layer and SiN seed layer to foam a resonator device that comprises the (200)-oriented texture TiN layer and SiN seed layer.

12. A superconducting device, comprising:
    a substrate;
    a silicon nitride (SiN) seed layer disposed on the substrate, wherein the SiN seed layer has a thickness in a range of about 1 nm to about 3 nm; and
    a (200)-oriented texture titanium nitride (TiN) layer grown on the SiN seed layer using the SiN seed layer for nucleation of the (200)-oriented texture TiN layer growth.

13. The superconducting device of claim 12, wherein the superconducting device comprises a resonator device.

14. The superconducting device of claim 13, wherein the resonator device comprises a coplanar waveguide.

15. The superconducting device of claim 13, wherein the resonator device comprises a qubit.

16. The superconducting device of claim 15, wherein the qubit comprises an interdigitated capacitor pattern formed by the SiN and (200)-oriented texture TiN layers.

17. The superconducting device of claim 13, wherein the resonator device comprises at least one planar capacitor and one planar inductor connected in parallel.

18. An integrated circuit, comprising:
    a substrate; and
    one or more superconducting devices formed on the substrate,
    wherein each superconducting device comprises:
        a silicon nitride (SiN) seed layer disposed on the substrate, wherein the SiN seed layer has a thickness in a range of about 1 nm to about 3 nm; and
        a (200)-oriented texture titanium nitride (TiN) layer grown on the SiN seed layer using the SiN seed layer for nucleation of the (200)-oriented texture TiN layer growth.

19. The integrated circuit of claim 18, wherein the one or more superconducting devices comprises a resonator device.

20. The integrated circuit of claim 19, wherein the resonator device comprises an interdigitated capacitor pattern formed by the SiN and (200)-oriented texture TiN layers.

* * * * *